(12) United States Patent
Batinica et al.

(10) Patent No.: US 9,978,582 B2
(45) Date of Patent: May 22, 2018

(54) METHODS FOR IMPROVING WAFER PLANARITY AND BONDED WAFER ASSEMBLIES MADE FROM THE METHODS

(71) Applicant: Ostendo Technologies, Inc., Carlsbad, CA (US)

(72) Inventors: Gregory Batinica, San Diego, CA (US); Kameshwar Yadavalli, Carlsbad, CA (US); Qian Fan, Carlsbad, CA (US); Benjamin A. Haskell, Carlsbad, CA (US); Hussein S. El-Ghoroury, Carlsbad, CA (US)

(73) Assignee: Ostendo Technologies, Inc., Carlsbad, CA (US)

( * ) Notice: Subject to any disclaimer, the term of this patent is extended or adjusted under 35 U.S.C. 154(b) by 0 days. days.

(21) Appl. No.: 15/379,759

(22) Filed: Dec. 15, 2016

(65) Prior Publication Data

US 2017/0178891 A1 Jun. 22, 2017

Related U.S. Application Data (60) Provisional application No. 62/268,262, filed on Dec. 16, 2015.

(51) Int. Cl.
*H01L 21/302* (2006.01)
*H01L 21/02* (2006.01)
(Continued)

(52) U.S. Cl.
CPC .. *H01L 21/02035* (2013.01); *H01L 21/02002* (2013.01); *H01L 22/20* (2013.01); *H01L 23/3171* (2013.01); *H01L 24/94* (2013.01); *H01L 29/2003* (2013.01); *H01L 29/30* (2013.01); *H01L 21/0217* (2013.01);
(Continued)

(58) Field of Classification Search
None
See application file for complete search history.

(56) References Cited

U.S. PATENT DOCUMENTS

| 4,790,920 A | 12/1988 | Krzanich |
| 4,830,984 A * | 5/1989 | Purdes ............... H01L 21/02381 117/106 |

(Continued)

OTHER PUBLICATIONS

"International Search Report and Written Opinion of the International Searching Authority dated Feb. 24, 2017; International Application No. PCT/US2016/067379", (Feb. 24, 2017).

*Primary Examiner* — Sitaramarao S Yechuri
(74) *Attorney, Agent, or Firm* — Womble Bond Dickinson (US) LLP (57) ABSTRACT

A method to improve the planarity of a semiconductor wafer and an assembly made from the method. In a preferred embodiment of the method, a compressive PECVD oxide layer such as $SiO_2$ having a predetermined thickness or pattern is deposited on the second surface of a semiconductor wafer having an undesirable warp or bow. The thickness or pattern of the deposited oxide layer is determined by the measured warp or bow of the semiconductor wafer. The compressive oxide layer induces an offsetting compressive force on the second surface of the semiconductor wafer to reduce the warp and bow across the major surface of the semiconductor wafer.

20 Claims, 4 Drawing Sheets

(51) Int. Cl.
*H01L 21/66* (2006.01)
*H01L 23/31* (2006.01)
*H01L 23/00* (2006.01)
*H01L 29/20* (2006.01)
*H01L 29/30* (2006.01)

(52) U.S. Cl.
CPC .. *H01L 21/02164* (2013.01); *H01L 21/02172* (2013.01); *H01L 21/02274* (2013.01); *H01L 23/562* (2013.01); *H01L 2224/94* (2013.01); *H01L 2924/3511* (2013.01)

(56) References Cited

U.S. PATENT DOCUMENTS

| | | | |
|---|---|---|---|
| 5,286,671 | A | 2/1994 | Kurtz et al. |
| 6,652,356 | B1 | 11/2003 | Ariga |
| 7,880,278 | B2 | 2/2011 | Jeng et al. |
| 2003/0162368 | A1* | 8/2003 | Connell ................ H01L 21/78 438/465 |
| 2007/0194342 | A1 | 8/2007 | Kinzer |
| 2007/0267724 | A1* | 11/2007 | Jeng ..................... H01L 21/302 257/632 |
| 2010/0314725 | A1* | 12/2010 | Gu ................... H01L 21/76898 257/635 |
| 2012/0301832 | A1* | 11/2012 | Tsuruda ................. B32B 38/10 430/322 |
| 2013/0193573 | A1* | 8/2013 | Shen ................ H01L 21/76898 257/741 |
| 2013/0307372 | A1* | 11/2013 | Ito ........................... H03H 3/02 310/311 |
| 2014/0038391 | A1* | 2/2014 | Herman ............ H01L 21/02381 438/462 |
| 2014/0186977 | A1* | 7/2014 | Yokokawa ........... G01B 11/306 438/14 |
| 2014/0235005 | A1* | 8/2014 | Lee .................... H01L 21/0254 438/46 |
| 2014/0374879 | A1* | 12/2014 | Chen ..................... H01L 21/302 257/532 |

* cited by examiner

METHODS FOR IMPROVING WAFER PLANARITY AND BONDED WAFER ASSEMBLIES MADE FROM THE METHODS

CROSS-REFERENCE TO RELATED APPLICATIONS

This application claims the benefit of U.S. Provisional Patent Application No. 62/268,262 filed Dec. 16, 2015.

BACKGROUND OF THE INVENTION

1. Field of the Invention

The invention generally relates to semiconductor fabrication methods. More specifically, the invention relates to: 1) a method for enhancing the flatness, i.e.; the planarity of a warped or bowed semiconductor wafer using oxide deposition techniques to increase semiconductor wafer and die yields, and, 2) a bonded semiconductor wafer assembly made from the method.

2. Prior Art

Industry-standard semiconductor wafers and in particular, GaN-on-sapphire semiconductor wafers, substrates or templates, are common in photonic applications but often have surface non-planarity. The undesirable non-planarity of a semiconductor wafer can be characterized by warp and/or bowing. Typical warp and/or bow measurements on semiconductor wafers are affected by measurement method and edge exclusion region definition. The smaller the edge exclusion region, the higher the measured warp and/or bow. Semiconductor wafer warp and/or bow are also affected by the diameter of the semiconductor wafer and by the thicknesses of the underlying substrate and grown epitaxial layers on standard semiconductor wafers. Semiconductor wafer warp may be on the order of 100 μm or greater across the surface of a 4-in. substrate and such non-planarity is an impediment in many semiconductor processes.

Undesirable non-planar semiconductor wafer profiles are generally convex and it is important to minimize or eliminate such non-planarity to improve processing yields in later fabrication steps. In standard applications, warp in a substrate is desirably reduced to at least less than 80 μm across a 4-in. semiconductor wafer and greater reductions of warp/bow further improve semiconductor wafer bonding properties in subsequent processing steps.

The warp of a 4-in. photonic semiconductor wafer should be less than 80 μm to be accepted by a typical photolithographic stepper, such as a Canon stepper for example, in terms of mechanical handling (e.g.; vacuum arm and chuck), which in turn improves the local planar focus. Commonly, semiconductor wafer bow negatively affects vacuum arm pick up of the semiconductor wafer (from a cassette for example) and excessive semiconductor wafer warp negatively affects the suction of the semiconductor wafer onto the chuck. It is desired that any residual bow remains convex on the first semiconductor wafer surface rather than concave for improved subsequent processing of the semiconductor wafer.

An inexpensive process for reducing non-planarity and improving semiconductor wafer shape profile of the aforementioned semiconductor wafers is needed to improve yields in subsequent semiconductor wafer processing steps.

DETAILED DESCRIPTION OF THE PREFERRED EMBODIMENTS

In existing semiconductor fabrication steps, it is generally desired that the warp and/or bow of an unprocessed semiconductor wafer be as low as possible before processing by a semiconductor photolithographic stepper and semiconductor wafer bonding equipment.

A preferred method of this invention comprises the step of an engineered patterning and deposition of a compressive dielectric material thin film layer (such as, without limitation, a PECVD oxide such as silicon oxide-$SiO_2$) of a predetermined thickness, pattern and composition, or a tensile layer of such material, to provide an offsetting compressive or tensile force across the surface of a semiconductor wafer to reduce undesirable warp and bow in the semiconductor wafer. The planarizing effect of the above offsetting dielectric layer has been measured by Applicant herein and has been shown to materially improve the warp and/or bow properties of a non-planar photonic semiconductor wafer, resulting in improved yields during follow-on photolithography and semiconductor wafer bonding steps.

Figure 1A:
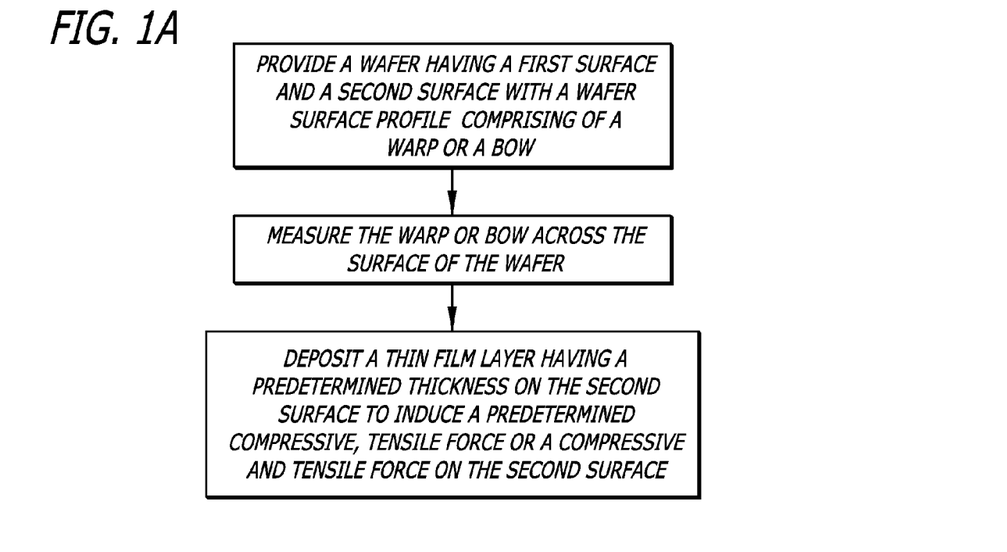
FIG. 1A is a process flow chart of a preferred set of steps of the method of the invention.
Figure 1B:
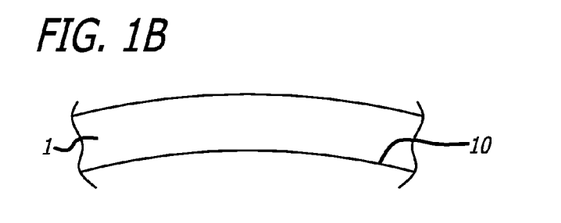
FIG. 1B is a cross-section of a semiconductor wafer having a convex warp or bow.
Figure 1C:
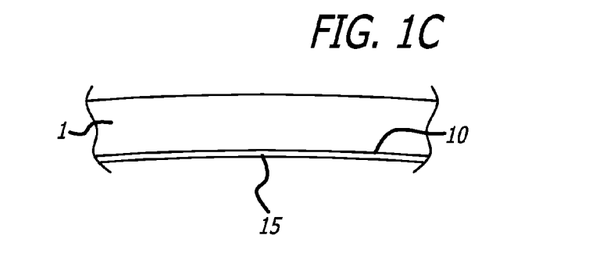
FIG. 1C is a cross-section of the semiconductor wafer after having a thin film layer deposited on its second surface.

In a first aspect of the invention as depicted in FIGS. 1A-1D, a method is disclosed for reducing warp and/or bow in a semiconductor wafer comprising the steps of providing a semiconductor wafer 1 having a first surface and a second surface 10 wherein the surface profile of semiconductor wafer 1 comprises a warp and/or a bow as illustrated in FIG. 1B. Normally, the first surface of the semiconductor wafer will be the surface of the semiconductor wafer in or on which the circuitry or other electronic or electrical devices are formed, though that is not a limitation of the invention, and in some cases electronic or electrical devices may be formed on the second surface or both surfaces of the semiconductor wafer. The warp and/or bow are measured across a surface of semiconductor wafer 1, normally but not necessarily across the convex surface of the semiconductor wafer. A thin film layer 15 having a predetermined thickness, pattern or coefficient of thermal expansion ("CTE") is deposited on the second surface 10 to induce a predetermined strain-modifying compressive or tensile force or a compressive and tensile force on and across the second surface 10 of semiconductor wafer 1. In the specific embodiment illustrated in FIGS. 1B and 1C, the thin film layer 15 is deposited on the second surface 10 to induce a predetermined strain-modifying tensile force on and across the second surface 10 of semiconductor wafer 1, causing the semiconductor wafer to substantially flatten, though preferably to leave a slight convex semiconductor wafer profile, as opposed to a semiconductor wafer profile that is a bit high in some locations and a bit low in other locations. The thin film layer 15 may comprise an oxide layer, metal layer, metal oxide layer or ceramic material layer or equivalent layer materials. The thickness, pattern or CTE of thin film layer 15 may be calculated and determined based on the measured warp and/or bow. As one example, thin film layer 15 may comprise an $SiO_2$ layer. Thin film layer 15 may be deposited using a PECVD process. Thin film layer 15 may have a thickness of about 1 μm per about 5 μm to about 8 μm of warp or bow. Semiconductor wafer 1 may comprise a GaN layer on a sapphire semiconductor wafer, substrate or template.

Figure 1D:
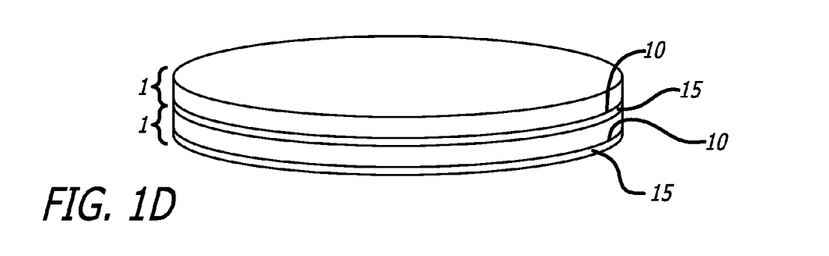
FIG. 1D illustrates a pair of semiconductor wafers that have been processed according to the method of the invention and fusion bonded to form a semiconductor wafer assembly.

In a further aspect of the invention depicted in FIG. 1D, a pair of semiconductor wafers 1, wherein one or both semiconductor wafers 1 have been processed according to the method of the invention, are bonded together, such as by fusion bonding or equivalent bonding methods as are known to persons skilled in the semiconductor wafer bonding arts, to provide a high quality bonded semiconductor wafer assembly. While the semiconductor wafers are shown bonded with a specific stacking relationship, in some applications one semiconductor wafer might be reversed, surface to surface, as again the greater planarity of each semiconductor wafer resulting from the application of the present invention improves the quality of the bond and accuracy of the relative location of the two semiconductor wafers, yielding a greater yield and better performance of the final product.

By way of example and not by limitation, a 4-in. semiconductor wafer desirably has a warp of less than about 80 μm for processing in industry-standard stepper equipment. For instance, when a semiconductor wafer is accepted by a Canon stepper, acceptable warpage or bowing is typically desired to be less than about 40-50 μm warp or bow across the surface of the semiconductor wafer. Warpage or bowing below 40-50 μm semiconductor wafer warp/bow is further desired, particularly for subsequent semiconductor wafer fusion bonding applications. Any remaining warpage/bow is desirably convex across the first surface of the semiconductor wafer. Similarly, subsequent processing of such semiconductor wafers that includes bonding with other semiconductor wafers demands a high level of wafer planarization. For example, the bonding of 4-in. semiconductor wafers using either direct fusion bonding or eutectic bonding would typically require less than 40-50 μm warp or bow across the surface of the semiconductor wafers, with flatter semiconductor wafers typically yielding reduced edge exclusion in the bonding process.

Unfortunately, conventional photonic semiconductor wafers, such as III-nitride semiconductor wafers on sapphire or silicon substrates, are frequently supplied with a semiconductor wafer surface profile having at least some degree of warpage and/or bowing.

Applicant herein discloses a method for minimizing semiconductor wafer warp and bowing. In a preferred set of the process steps of the invention, the steps are carried out using a deposition process with a plasma-enhanced chemical vapor deposition (PECVD) tool to deposit a silicon dioxide or "$SiO_2$" ("oxide" herein), thin film layer 15 having a predetermined thickness and composition on second (non-circuit bearing) surface 10 of semiconductor wafer 1. It is expressly noted that the invention is not limited to the use of $SiO_2$ as a planarizing thin film layer 15 and different materials, such as those noted below and their equivalents, can be used as planarizing thin film layers 15 in the instant invention.

In a preferred embodiment of this invention, the atomic spacing of the oxide thin film layer 15 deposited on the second surface 10 of the semiconductor wafer 1 is greater than the atomic spacing of the substrate or template, such as sapphire, upon which the photonic material, such as III-nitride material, is deposited. The different atomic spacing creates a lattice mismatch between the two materials, resulting in an induced tension on the second surface of the semiconductor wafer 1. As a result, the deposited oxide thin film layer 15 seeks a larger surface area than is provided by the sapphire substrate or template, creating a strain tending to enlarge the second surface of the semiconductor wafer, which in turn tends to flatten the sapphire substrate as the oxide thin film layer 15 seeks to expand the second surface area 10. The foregoing assumes of course that the first surface of the semiconductor wafer was convex. Thus the layer 15 in this and other embodiments acts as a strain-modifying layer reducing the warp or bow across the first and second surfaces of the semiconductor wafer compared to the warp or bow across the surface of the semiconductor wafer before the layer 15 is deposited.

In addition to lattice mismatch-related strain, thermal expansion mismatch-related strain plays a significant role in changing a semiconductor wafer 1 shape which phenomenon is exploited in an alternative embodiment of the instant invention. As earlier indicated, there are two primary mechanisms involved in an induced film stress; atomic spacing (i.e.; lattice mismatch) and coefficient of thermal expansion ("CTE") differences. CTE may be considered as the amount volumes and linear dimensions change with respect to temperature. CTE is mathematically defined as: $\alpha=(1/D)(\Delta D/\Delta T)$ where $\alpha$ is the CTE; D is volume, area or a linear dimension and T is temperature. Normally materials expand when heated though these dimensional changes vary from material to material.

CTE itself is a physical phenomenon and is exploited in a preferred embodiment as a semiconductor wafer planarizing method, particularly when certain thin film layer 15 materials are deposited on a semiconductor wafer 1 surface at a temperature other than room temperature. CTE occurs due to the fact that as temperature increases, higher level quantum states in a material become more populated in the asymmetric potential wells. These higher level quantum states have probability densities that increase at values greater than the equilibrium radius. In other words, on a time average, atoms spend more time at a farther distance away from each other as temperature increases. If there is a CTE mismatch between two materials, the amount of average atomic spacing change with temperature is different for each material. A basic example of CTE film stress (neglecting lattice mismatch) is where a film with a larger CTE than the host substrate is deposited at an elevated temperature. At the deposition temperature, the structure is stress-neutral but once the structure cools, thin film layer 15 will contract more than the substrate, causing thin film layer 15 to be in tensile or compressive stress (depending on the film material CTE) across second surface 10.

A preferred set of process steps for a oxide deposition of the invention may comprise the following parameters as set forth in Table 1:

TABLE 1

Exemplar Process Parameters

Temperature = about 100 to 400° C.
Deposition Pressure = about 100 to 2000 mTorr
$N_2$ Flow = about 10 to 2000 sccm
95% $N_2$/5% $SiH_4$ Flow = about 10 to 2000 sccm
-or-
100% $SiH_4$ Flow = about 0.5 to 50 sccm
$N_2O$ Flow = about 100 to 3000 sccm
RF Power = about 100 to 1000 W at about 13.56 MHz
Deposition rate = about 500 to 5000 Å/min
BOE (6:1 Buffered Oxide Etchant) rate of resultant oxide = about 500 to 5000 Å/min
Oxide Film Stress = about 100 to 1000 MPa compressive on Si(100)

The deposited oxide thin film layer 15 preferably has a non-uniformity of less than about 10%. Processing temperatures during oxide thin film layer 15 deposition are not a substantial processing constraint as it has been observed that an oxide thin film layer 15 deposited within the range of about 300° C. and 400° C. exhibits an acceptable compressive effect.

Using the above exemplar process parameters, the preferred embodiment of this invention results in roughly about 5-8 μm of warp or bow relief per 1 μm of oxide thin film layer 15 deposited.

Figure 2A:
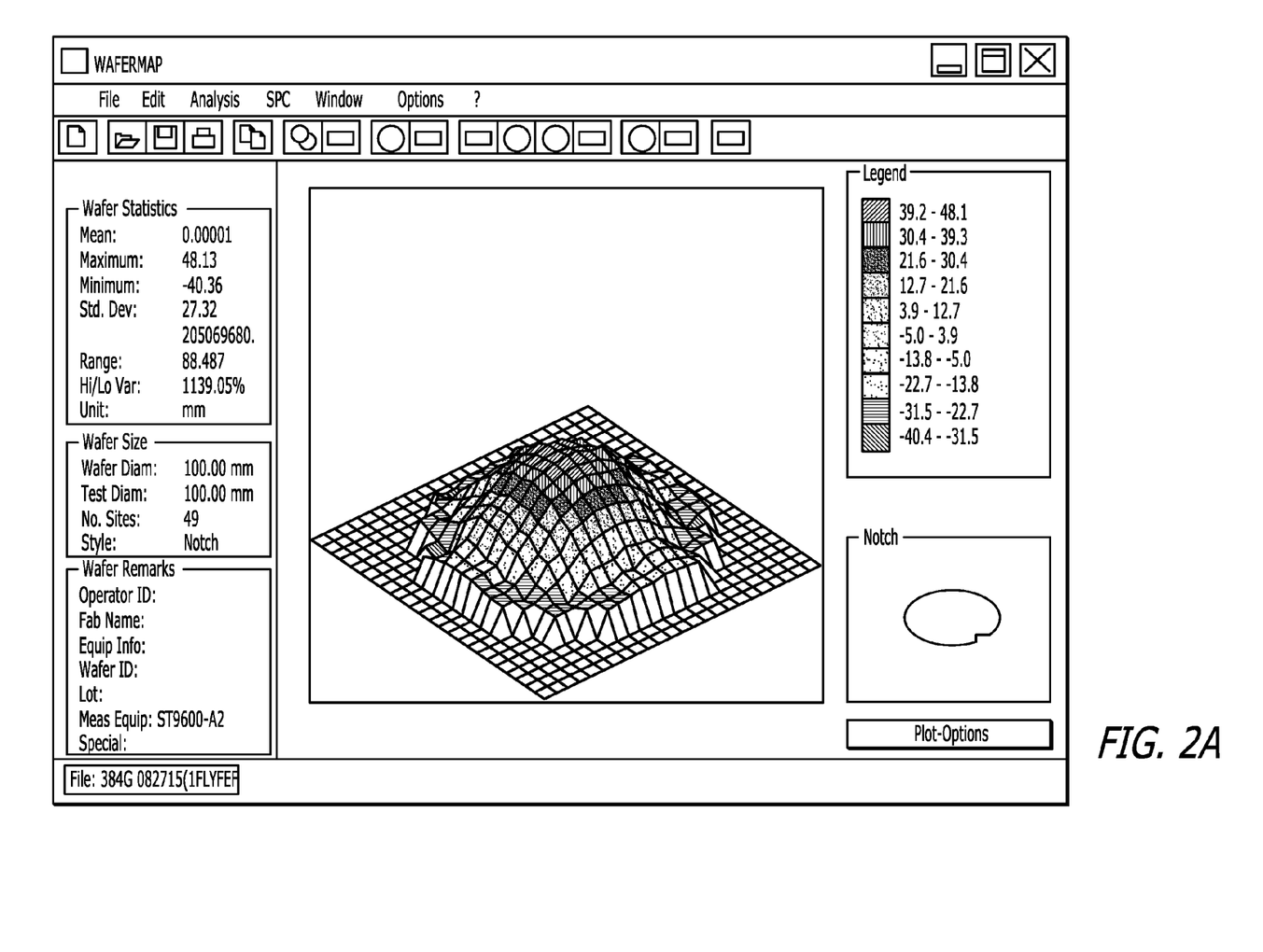
FIG. 2A is a wafer planarity map of a semiconductor wafer with a warp or bow that has not been processed according to the method of this invention.
Figure 2B:
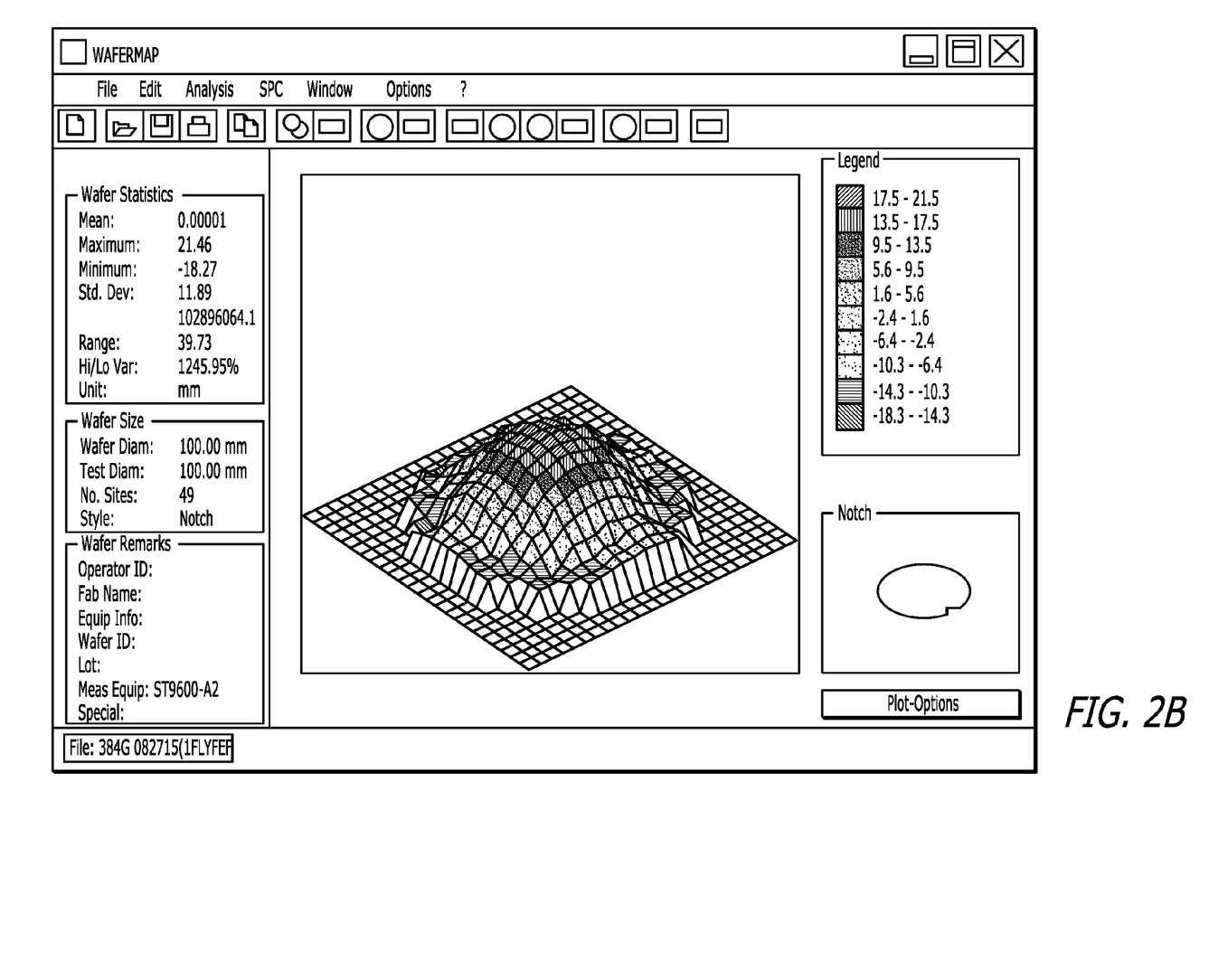
FIG. 2B is a wafer planarity map of the semiconductor wafer of FIG. 2A after being processed according to the method of the invention.

Referring to FIGS. 2A and 2B, a graphical depiction of warp and bow adjustment data from semiconductor wafer metrology measurements conducted using Sigmatech back-pressure semiconductor wafer shape measurement equipment is set forth showing planarity improvement from an unprocessed semiconductor wafer (FIG. 2A) to the same semiconductor wafer that has been processed according to the method of this invention (FIG. 2B). This planarity improvement manifests itself in the lower range of the measurements in the legend of these Figs.

Experimental practice of a preferred embodiment of this invention resulted in an average warp reduction of about 6.3 μm for 1 μm of oxide thin film layer 15 deposited on 4-in. semiconductor wafers 1 that were processed according to the methods of this invention, with an average bow reduction of about 3.4 μm for 1 μm oxide deposited.

Total thickness variation or "TTV" can increase or decrease roughly by the non-uniformity of the deposited oxide thin film layer 15 and such semiconductor wafer 1 thickness scales at about 80-90% of the target deposited oxide thickness.

In a sample semiconductor wafer processing run using the steps of the invention, after a target 2 μm oxide thin film layer 15 deposition, semiconductor wafer warp was shown to decrease from 56.5 to 43.3 μm; bow was shown to decrease from 29.2 to 22.7 μm; TTV was shown to increase from 6.8 to 7.4 μm; and semiconductor wafer thickness shown to increase from 662.9 to 664.7 μm. Further exemplar warp reduction data is shown in Table 2 below.

TABLE 2

Change in Wafer Warp with Second Surface Oxide Deposition Thickness

| Wafer 384G | | Wafer 385G | |
|---|---|---|---|
| Oxide Deposited (μm) | Warp (μm) | Oxide Deposited (μm) | Warp (μm) |
| 0 | 88.3 | 0 | 86.4 |
| 2 | 75.1 | 2 | 74.2 |
| 4 | 64.4 | 4 | 63.7 |
| 6 | 52.7 | 6 | 52.1 |
| 8 | 39.3 | 7 | 43.8 |

It is noted that once a second surface warp and bow adjustment oxide thin film layer 15 is deposited, it is preferable that semiconductor wafer 1 not be exposed to buffered oxide etchants or "BOE" and HF, unless a warp and bow adjust oxide thin film layer 15 deposition step is repeated.

Further, deposited thin film layer 15 oxide thickness uniformity may have some effect on subsequent processing steps such as laser liftoff (LLO) uniformity, for example. LLO uniformity may be affected by the quarter-wavelength interference condition of the UV laser light caused by oxide thin film layer 15 uniformity and not by UV absorption of the layer 15.

It is expressly noted that the methods of this invention need not be practiced solely using the exemplar preferred compressive PECVD oxide thin film layer 15 deposited on c-plane sapphire which is the example used for illustration and discussion purposes and not by way of limitation. The method and claims of the invention expressly encompass the use of any high-stress thin film layer 15 deposited on any surface of any semiconductor wafer 1 so as to manipulate the shape, warp and bow of semiconductor wafer 1. The deposited thin film layer 15 is thus not limited to silicon dioxide material; any suitable thin film layer 15 that may be deposited on a semiconductor wafer 1 surface at a predetermined thickness that is sufficient to induce a predetermined compressive, tensile force or a compressive and tensile force due to lattice mismatch or differing CTEs on the second surface 10, may be used.

Figure 3A:
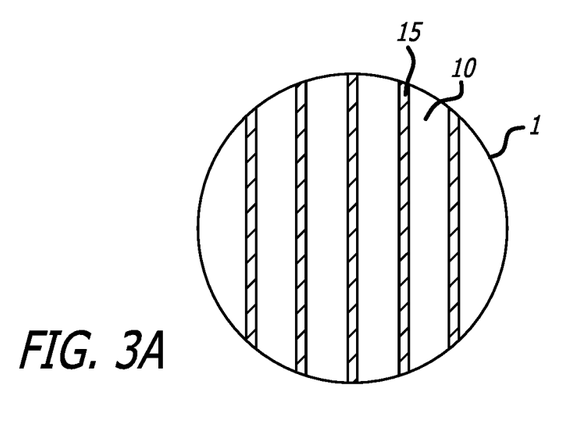
FIG. 3A is a second surface of a semiconductor wafer that has been patterned with a thin film layer according to a method of the invention.
Figure 3B:
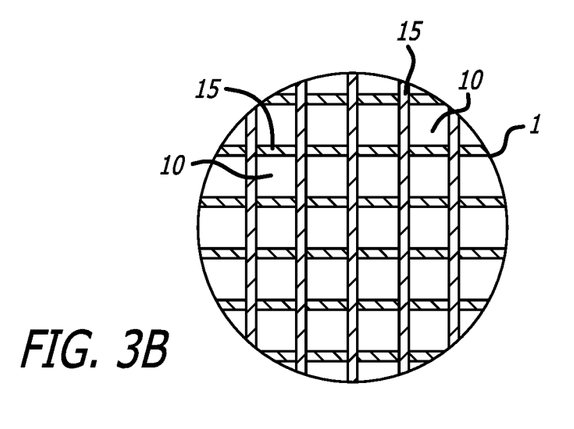
FIG. 3B is a second surface of a semiconductor wafer that has been patterned with two thin film layers according to another method of the invention.

Alternate methods are illustrated in FIGS. 3A and 3B. In FIG. 3A, the thin film layer 15 is patterned to form elongated strips of the thin film layer, which provides a dominant axis for the strain-modifying effect, whether the thin film layer 15 is chosen to exert compressive forces or tensile forces on the adjacent surface 10 of the semiconductor wafer 1. This can be useful when the bow or warp is about a single axis, or predominately about a single axis. If however the bow or warp is about two axes, but unequal, a second patterned thin film layer 15 may be deposited and oriented about a second axis as shown in FIG. 3B. Note also that unequal strains may be also obtained by simply choosing the width of the strips of layer 15 in FIG. 3A. Also in FIG. 3B, the vertical and horizontal strips may be of the same or different thin film layer materials. In that regard, in some cases, the bow or warp may be in opposite directions about the two axes, in which case different thin film layer materials will be used, one to induce compressive forces on the adjacent semiconductor substrate and one to induce tensile forces on the adjacent substrate.

Numerous suitable thin film layer 15 materials which may be deposited on a semiconductor wafer 1 surface are commercially available that are of dissimilar composition and, as such, impart sufficient semiconductor wafer surface strain, thus changing the semiconductor wafer 1 surface profile.

Silicon oxide is well-suited for such applications because it is simple to deposit on a semiconductor wafer 1 surface and can be grown in a stress state that reshapes the bow and warp of semiconductor wafer 1 but in alternative embodiments, materials such as silicon nitride, ceramic, metal, or metal oxide thin film layers 15 may be used and are contemplated as within the scope of the method of the invention. Further, the above-referenced semiconductor wafer 1 may be regarded as having a generic shape and the methods of this invention function to flatten any generic substrate shape by the deposition of a strain-modifying or compression-modifying thin film layer 15 or films on second surface 10 of semiconductor wafer 1. Thus the primary variables for the thin film layer are material, thickness and thin film layer pattern, together with the coefficient of thermal expansion that is a characteristic of the material, which in some cases may be different for different film thicknesses of interest for the same material.

In the previously-discussed preferred embodiment of c-plane GaN-on-sapphire, semiconductor wafer 1, as viewed with epitaxial surface up, often tends to be fairly uniformly convex, i.e.; the highest point is toward the center of the GaN surface. In such instances, the earlier-described deposition of a blanket compressive oxide thin film layer 15 on the second surface of semiconductor wafer 1 is particularly effective. It is expressly noted however that deposited thin film layer 15 need not be limited to an $SiO_2$ material and that the deposited thin film layer material may be any material that imparts an opposite curvature to semiconductor wafer 1 as compared to the GaN or semiconductor wafer material.

In an instance where semiconductor wafer 1 is concave, rather than applying a compressive thin film layer 15 to the second surface of the semiconductor wafer as in the aforementioned convex down non-planarity, a deposited thin film layer 15 may be applied that imparts tensile stress to the sapphire. GaN itself is a suitable candidate for this embodiment of the invention.

In the generic case of semiconductor wafer 1 having different curvatures in different crystallographic directions, such as semipolar GaN grown on m-plane sapphire, this invention enables a reduction in the bow along one axis but may increase it in the perpendicular direction.

To address this concern, an alternate embodiment is disclosed in which a "shadow mask" as is known in the semiconductor arts, may be utilized to selectively deposit a strain-modifying thin film layer 15 having predetermined strain-modifying or tensile characteristics on different portions or areas of second surface 10 of semiconductor wafer 1.

An equivalent effect may also be achieved by depositing a blanket planarizing thin film layer 15 on second surface 10 of semiconductor wafer 1, patterning semiconductor wafer 1 using photolithography with a predetermined thin film layer 15 pattern such as the exemplar pattern illustrated in FIGS. 3A-3B, and then selectively removing predetermined areas or portions of the planarizing thin film layer 15 to induce a desired change in the wafer planarity.

By way of example and not by limitation, by using a shadow mask having a predetermined strain-modifying pattern thereon, a user may deposit a compressive thin film layer 15 oxide as strips consisting of, for example, two-thirds of the semiconductor wafer area and, for example, a tensile nitride on the central third of semiconductor wafer 1 to modify the shape differently along different axes (FIGS. 3A and 3B).

The differing or varying compressive/tensile layer pattern may be determined using, for instance, strain modeling software based on a given semiconductor wafer shape to model an optimum modifying thin film layer or layers 15 combination pattern for a particular semiconductor wafer bow.

Many alterations and modifications may be made by those having ordinary skill in the art without departing from the spirit and scope of the method of the invention herein. Therefore, it must be understood that the illustrated embodiment has been set forth only for the purposes of example and that it should not be taken as limiting the invention as defined by any claims in any subsequent application claiming priority to this application.

For example, notwithstanding the fact that the elements of such a claim may be set forth in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus, if an element can be understood in the context of this specification as including more than one meaning, then its use in a subsequent claim must be understood as being generic to all possible meanings supported by the specification and by the word itself.

The definitions of the words or elements of any claims in any subsequent application claiming priority to this application should be, therefore, defined to include not only the combination of elements which are literally set forth, but all equivalent structure, material or acts for performing substantially the same function in substantially the same way to obtain substantially the same result. In this sense, it is therefore contemplated that an equivalent substitution of two or more elements may be made for any one of the elements in such claims below or that a single element may be substituted for two or more elements in such a claim.

Although elements may be described above as acting in certain combinations and even subsequently claimed as such, it is to be expressly understood that one or more elements from a claimed combination can in some cases be excised from the combination and that such claimed combination may be directed to a subcombination or variation of a subcombination.

Insubstantial changes from any subsequently claimed subject matter as viewed by a person with ordinary skill in the art, now known or later devised, are expressly contemplated as being equivalently within the scope of such claims. Therefore, obvious substitutions now or later known to one with ordinary skill in the art are defined to be within the scope of the defined elements.

Any claims in any subsequent application claiming priority to this application are thus to be understood to include what is specifically illustrated and described above, what is conceptually equivalent, what can be obviously substituted and also what essentially incorporates the essential idea of the invention.

What is claimed is:
1. A semiconductor wafer comprising:
   a semiconductor wafer having a first surface and a second surface; and
   at least one strain-modifying layer on the second surface inducing a compressive force, tensile force or compressive and tensile forces on the second surface to reduce a warp or bow of the semiconductor wafer before the at least one strain-modifying layer is applied;
wherein the at least one strain-modifying layer comprises first and second strain-modifying layers;
wherein the first strain-modifying layer is patterned to form a plurality of elongated layer segments extending in a first direction on the semiconductor wafer, and the second strain-modifying layer is patterned to form a plurality of elongated layer segments extending in a second direction on the semiconductor wafer;
wherein the first strain-modifying layer applies a compressive force on the second surface and the second strain-modifying layer applies a tensile force on the second surface.

2. The semiconductor wafer of claim 1 wherein the at least one strain-modifying layer is selected from the group consisting of $SiO_2$, silicon nitride, a metal oxide material or a group III-nitride.

3. The semiconductor wafer of claim 1 wherein the semiconductor wafer is a GaN on sapphire wafer, substrate or template, and the strain modifying layer is an $SiO_2$ layer.

4. The semiconductor wafer of claim 1, wherein the first strain-modifying layer and the second strain-modifying layer are of the same or different layer materials.

5. The semiconductor wafer of claim 1, wherein:
the plurality of elongated layer segments extending in the first direction are formed by patterning the first strain-modifying layer with a first predetermined strain-modifying layer pattern and selectively removing predetermined portions of the first strain-modifying layer, and
the plurality of elongated layer segments extending in the second direction are formed by patterning the second strain-modifying layer with a second predetermined strain-modifying layer pattern and selectively removing predetermined portions of the second strain-modifying layer.

6. The semiconductor wafer of claim 1, wherein areas covered by the plurality of elongated layer segments extending in the first direction and the plurality of elongated layer segments extending in the second direction are approximately two-thirds of the area of the semiconductor wafer.

7. The semiconductor wafer of claim 1, wherein thickness of the at least one strain-modifying layer is determined based at least in part on the warp or bow measured across a surface of the semiconductor wafer.

8. The semiconductor wafer of claim 7, wherein the at least one strain-modifying layer has a thickness of 1 μm per each about 5 μm to 8 μm of warp or bow.

9. The semiconductor wafer of claim 1, wherein the at least one strain-modifying layer is deposited on the second surface in a plasma-enhanced chemical vapor deposition (PECVD) process.

10. The semiconductor wafer of claim 1, wherein the at least one strain-modifying layer is deposited on the second surface in a physical vapor deposition process.

11. A method of reducing warp or bow in a semiconductor wafer comprising:
providing a semiconductor wafer having a first surface and a second surface; and
depositing at least one strain-modifying layer on the second surface inducing a compressive force, tensile force or compressive and tensile forces on the second surface to reduce a warp or bow of the semiconductor wafer before the at least one strain-modifying layer is applied;
wherein the at least one strain-modifying layer comprises first and second strain-modifying layers;
wherein the first strain-modifying layer is patterned to form a plurality of elongated layer segments extending in a first direction on the semiconductor wafer, and the second strain-modifying layer is patterned to form a plurality of elongated layer segments extending in a second direction on the semiconductor wafer;
wherein the first strain-modifying layer applies a compressive force on the second surface and the second strain-modifying layer applies a tensile force on the second surface.

12. The method of claim 11, wherein the at least one strain-modifying layer is selected from the group consisting of $SiO_2$, silicon nitride, a metal oxide material or a group III-nitride.

13. The method of claim 11, wherein the semiconductor wafer is a GaN on sapphire wafer, substrate or template, and the strain modifying layer is an $SiO_2$ layer.

14. The method of claim 11, wherein the first strain-modifying layer and the second strain-modifying layer are of the same or different layer materials.

15. The method of claim 11, wherein:
the plurality of elongated layer segments extending in the first direction are formed by patterning the first strain-modifying layer with a first predetermined strain-modifying layer pattern and selectively removing predetermined portions of the first strain-modifying layer, and
the plurality of elongated layer segments extending in the second direction are formed by patterning the second strain-modifying layer with a second predetermined strain-modifying layer pattern and selectively removing predetermined portions of the second strain-modifying layer.

16. The method of claim 11, wherein areas covered by the plurality of elongated layer segments extending in the first direction and the plurality of elongated layer segments extending in the second direction are approximately two-thirds of the area of the semiconductor wafer.

17. The method of claim 11, further comprising:
measuring the warp or bow across a surface of the semiconductor wafer; and
determining thickness of the at least one strain-modifying layer based at least in part on the measured warp or bow.

18. The method of claim 17, wherein the at least one strain-modifying layer has a thickness of 1 μm per each about 5 μm to 8 μm of warp or bow.

19. The method of claim 11, wherein the at least one strain-modifying layer is deposited on the second surface in a plasma-enhanced chemical vapor deposition (PECVD) process.

20. The method of claim 11, wherein the at least one strain-modifying layer is deposited on the second surface in a physical vapor deposition process.

* * * * *